（12） United States Patent
Liebenow

(10) Patent No.: US 6,865,379 B1
(45) Date of Patent: Mar. 8, 2005

(54) AUTOMATIC RADIO BUTTON MUTE

(75) Inventor: Frank Liebenow, Dakota Dunes, SD (US)

(73) Assignee: Gateway Inc., Poway, CA (US)

( * ) Notice: Subject to any disclaimer, the term of this patent is extended or adjusted under 35 U.S.C. 154(b) by 0 days.

(21) Appl. No.: 09/566,784

(22) Filed: May 9, 2000

(51) Int. Cl.[7] .................................................. H04B 1/18
(52) U.S. Cl. ............................... 455/161.3; 455/161.1; 455/185.1; 455/186.1; 455/194.1; 455/226.1; 455/226.2
(58) Field of Search ........................... 455/161.1–161.3, 455/174.1, 173.1, 186.1, 184.1, 185.1, 194.1, 226.2–226.3, 134, 135

(56) References Cited

U.S. PATENT DOCUMENTS

| 4,476,582 A | * | 10/1984 | Strauss et al. | 455/166 |
|---|---|---|---|---|
| 4,947,456 A | | 8/1990 | Atkinson et al. | 455/165 |
| 5,390,343 A | * | 2/1995 | Rupprecht et al. | 455/161.3 |
| 5,428,825 A | * | 6/1995 | Tomohiro et al. | 455/186.1 |
| 5,471,661 A | | 11/1995 | Atkinson | 455/165.1 |
| 5,493,711 A | | 2/1996 | Koyama | 455/194.1 |
| 5,561,835 A | | 10/1996 | Worthy | 455/2 |
| 5,701,598 A | | 12/1997 | Atkinson | 455/161.2 |
| 5,822,686 A | | 10/1998 | Lundberg et al. | 455/161.3 |
| 5,839,050 A | | 11/1998 | Baehr et al. | 455/2 |
| 5,842,119 A | * | 11/1998 | Emerson et al. | 455/161.3 |
| 5,937,338 A | | 8/1999 | Tomita | 455/161.2 |
| 6,006,113 A | | 12/1999 | Meredith | 455/562 |
| 6,141,536 A | * | 10/2000 | Cvetkovic et al. | 455/45 |
| 6,161,002 A | * | 12/2000 | Migliaccio et al. | 455/150.1 |

* cited by examiner

Primary Examiner—Vivian Chin
Assistant Examiner—Tuan A Tran
(74) Attorney, Agent, or Firm—Scott Charles Richardson

(57) ABSTRACT

A system and method of eliminating static while utilizing pre-programmed tuner buttons on a radio is disclosed. The system of the present invention mutes a pre-programmed tuner button frequency when the radio signal for the pre-programmed frequency is below a threshold value. Further the system of the present invention may automatically tune to an alternate frequency when radio signal strength of the pre-programmed tuner button frequency is below a threshold value.

21 Claims, 6 Drawing Sheets

AUTOMATIC RADIO BUTTON MUTE

FIELD OF THE INVENTION

The present invention generally relates to the field of monitoring the strength of a broadcast signal and more particularly to muting of pre-selected frequencies when the strength of the signal has decreased below a threshold value.

BACKGROUND OF THE INVENTION

When a person is listening to a radio, it is desirable to be able to tune the radio stations that are sending a signal that may be clearly received by the radio. For example, some radios have a seek function in which the radio is tuned to the next radio station that has a signal that may be clearly received by the radio. This eliminates the need to scan the radio dial to try to find a radio station. Eliminating this requirement is also a safety feature that may prevent an accident when tuning of a radio occurs while operating a moving vehicle.

Also known to the art are tuner buttons which allow a user to pre-select frequencies and assign a particular frequency to a specific button. For example, a user enjoys 100.5 Megahertz on the Frequency Modulation band. The user may program a tuner button such that when the button is pressed, 100.5 may be tuned. However, the pre-programmed tuner buttons do not factor in the strength of the radio signal being received by the radio with regard to the particular frequency. If, for example, a particular radio station has been selected and stored as a pre-programmed tuner button and the user's radio is 200 miles away from the source of the radio signal, then when a person depresses the tuner button static may be present due to weakness of the radio signal being received by the radio.

It would be advantageous if a system could disable pre-programmed tuner buttons when the frequency being tuned is out of range for clear reception of the pre-programmed tuner button frequency, thus eliminating static that may be heard without use of the present invention. Further, it would be advantageous if the system could provide an indication of when the pre-programmed tuner button frequency is out of range for clear reception. It would also be advantageous if the system could tune an alternate frequency when a pre-programmed tuner button frequency is not within range for clear reception.

SUMMARY OF THE INVENTION

Accordingly, the present invention is directed to a system and method for disabling pre-programmed tuner buttons when the frequency being tuned is out of range for clear reception of the radio signal. The system and method of the present invention may be implemented with frequency modulation, amplitude modulation, and digital radio. The present invention is directed to alerting the user when a particular frequency is out of range for clear listening. The present invention is further directed to tuning the radio to an alternate frequency when the radio signal of the pre-programmed tuner button frequency is not above a threshold value, including tuning the next pre-programmed tuner button frequency, tuning the previous pre-programmed tuner button frequency, and tuning a frequency with a similar format as the selected pre-programmed tuner button frequency.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made to the presently preferred embodiment of the invention, an example of which is illustrated in the accompanying drawings.

Figure 1:
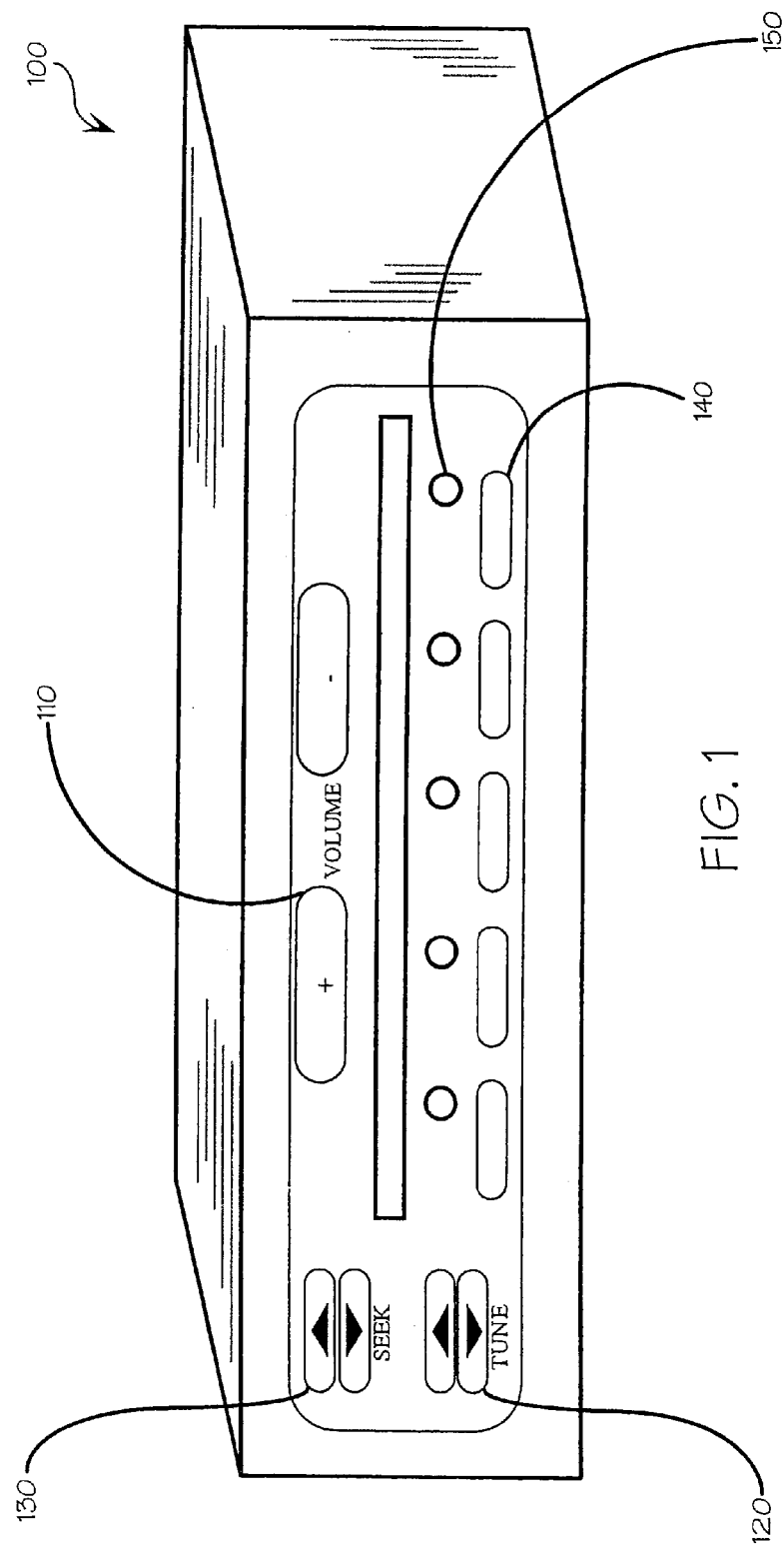
FIG. 1 depicts an exemplary embodiment of a broadcast receiving system in accordance with the present invention.

Referring to FIG. 1, a broadcast receiving system 100 in accordance with the present invention is shown. Typically, receivers come equipped with a volume control 110, balance (not shown), a tuning device 120, a seek function 130, and pre-programmed tuner buttons 140. The seek function 130 allows a user to press a button and the next frequency within range for clear reception may be tuned. The pre-programmed tuner buttons 140 allow a user to tune frequencies and store them such that when a particular pre-programmed tuner button is depressed, then a particular frequency is tuned. However, if the particular frequency is not within range and the particular pre-programmed button 140 is depressed, then the user may hear static.

The automatic radio button mute of the present invention prevents the user from hearing static when a particular frequency stored in the pre-programmed tuner button 140 is out of range for clear reception. It should be noted that the present invention may be utilized receiving a FM (frequency modulation) signal, an AM (amplitude modulation) signal, and a digital broadcast signal. In an exemplary embodiment, a receiver may come equipped with an indicator 150 to alert the user that a particular frequency stored on a pre-programmed tuner button 140 is out of range. An exemplary indicator 150 as shown in FIG. 1 may be a visible light that may be located in proximity to a pre-programmed tuner button 140.

Figure 2:
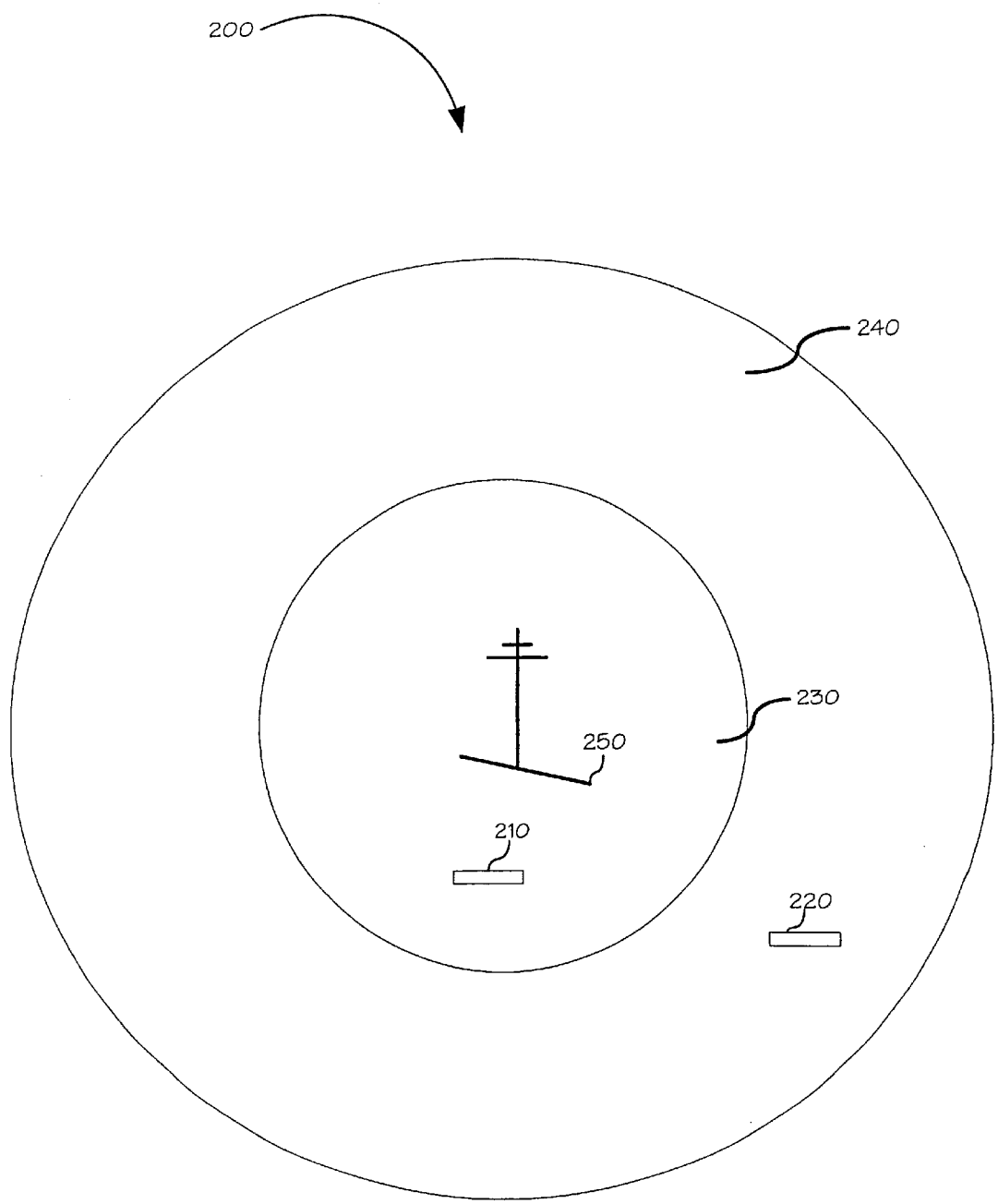
FIG. 2 depicts an exemplary diagram representing an area that may receive a strong signal and an area that may receive a weak signal.

Referring now to FIG. 2, an exemplary diagram 200 of the area in which a receiver may receive a particular frequency clearly and without static is shown. An antenna 250 may send a radio signal that may be received by radios in a generally circular area. In area 230, radios may be able to clearly receive the radio signal being transmitted from the antenna 250. However, in area 240 radios may not be able to clearly receive the radio signal from the antenna 250. The area covered by the transmitting signal from the antenna 250 varies dependent upon the antenna power, geography, weather, development of land, along with other factors. Thus, the area in which a radio may clearly receive a radio signal transmitted from an antenna 250 may not result in a circle, however, the present invention determines the strength of the signal being received and is not directly dependent on the proximity to the antenna 250.

As an example, if a radio is present in a vehicle 210 it may be able to receive the radio signal transmitted by the antenna 250. Suppose a user has the particular frequency of the radio signal being transmitted by the antenna 250 stored on a pre-programmed tuner button. When the vehicle 210 is in area 230 and depresses the pre-programmed tuner button relating to the frequency of the signal delivered by the antenna 250, then the radio may be tuned to the frequency of the radio station being transmitted by the antenna 250. However, when the vehicle 220 is located in area 240 and the same pre-programmed tuner button is depressed, if the signal being transmitted by the antenna 250 is not above a threshold value, then that particular pre-programmed tuner button may be disabled. While disabling the pre-programmed tuner button, a user may not hear static or other noise.

Figure 3:
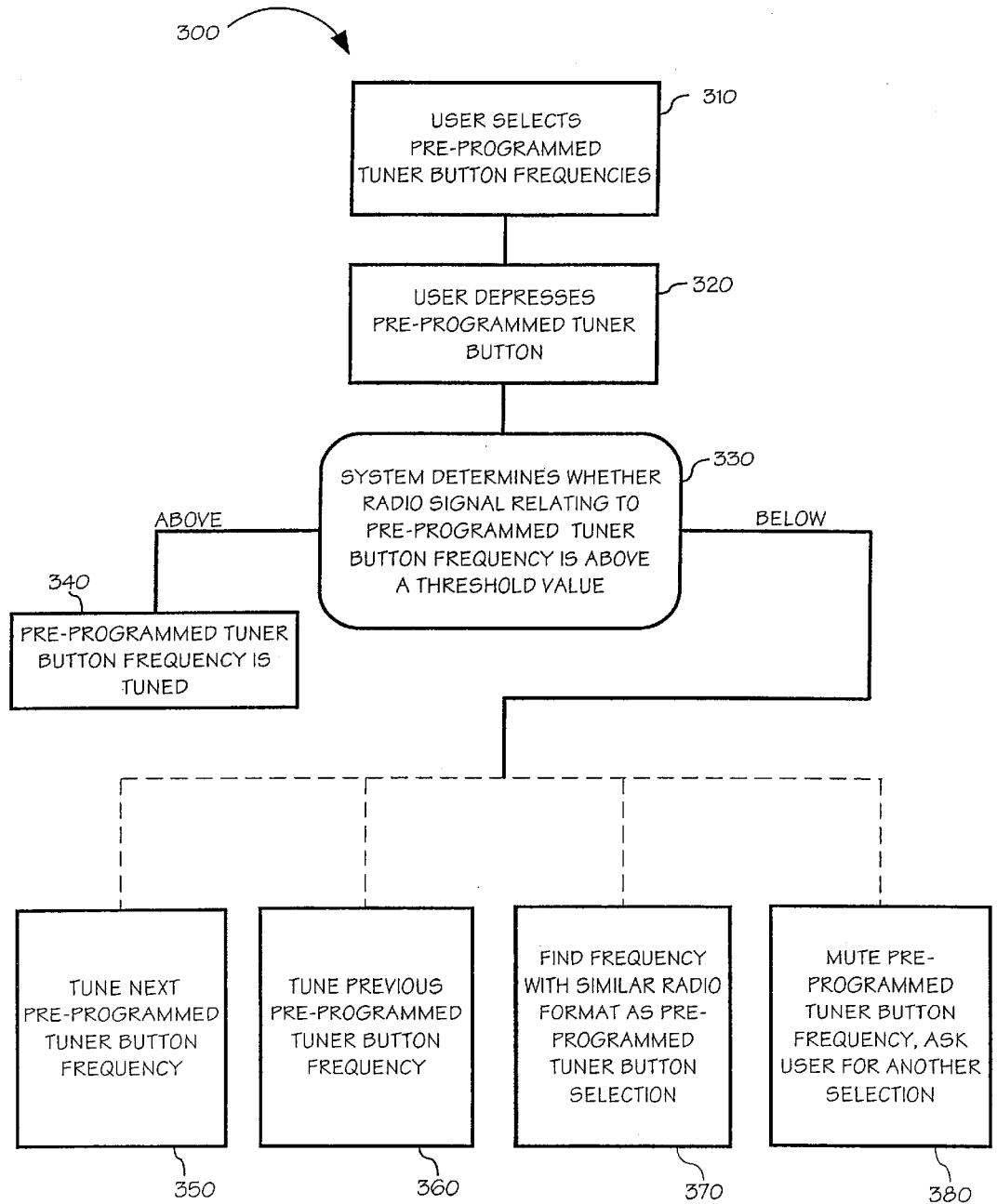
FIG. 3 is a flow diagram representing an exemplary process of the present invention.

Beyond disabling the pre-programmed tuner button frequency when the signal strength is below a threshold value, the present invention may tune to an alternate frequency and prompt the user that the pre-programmed tuner button frequency is out of range for clear reception. Referring to FIG. 3 an exemplary process 300 of the present invention is shown. The process may begin when a user selects the frequencies for his or her pre-programmed tuner buttons 310. The next step in an exemplary process may be the depressing a pre-programmed tuner button 320. At a time before or when a selection is made, the system of the present invention determines whether the signal strength relating to the pre-programmed tuner button frequency is above a threshold value 330. When the radio signal strength of the pre-programmed tuner button frequency is above a threshold value, then the pre-programmed tuner button frequency is tuned 340.

Several different actions may occur in exemplary embodiments of the present invention when the radio signal of the pre-programmed tuner button frequency is below a threshold value. First, the next pre-programmed tuner button frequency 350 may be tuned. Alternatively, the previous pre-programmed tuner button frequency 360 may be tuned. It should be noted that in an exemplary embodiment of the present invention, the radio signal of the alternative selection could be analyzed by the present invention to determine if the radio signal strength of the alternative selection is above a threshold value prior to tuning the alternative selection.

Another example of alternative tuning when the pre-programmed tuner button frequency signal strength is below a threshold value supported by the present invention is tuning to another radio station of a similar radio format 370. In an exemplary embodiment of the present invention, a database could be stored within the system of the present invention that may list stations across the world along with the location, frequency, and format, for example, jazz, country, rock, new age, and the like. Through the utilization of measuring the signal strength of various frequencies, the system of the present invention may be capable of determining its proximate location. Thus, for example, a user may tune a rock station and store it as a pre-programmed tuner button frequency. If the radio signal strength of the selection made is below a threshold value, then, in this embodiment, the present invention may search its database to find another rock station in the vicinity that may have a radio signal strength above a threshold value, and, having found it, tune to that station.

Figure 4:
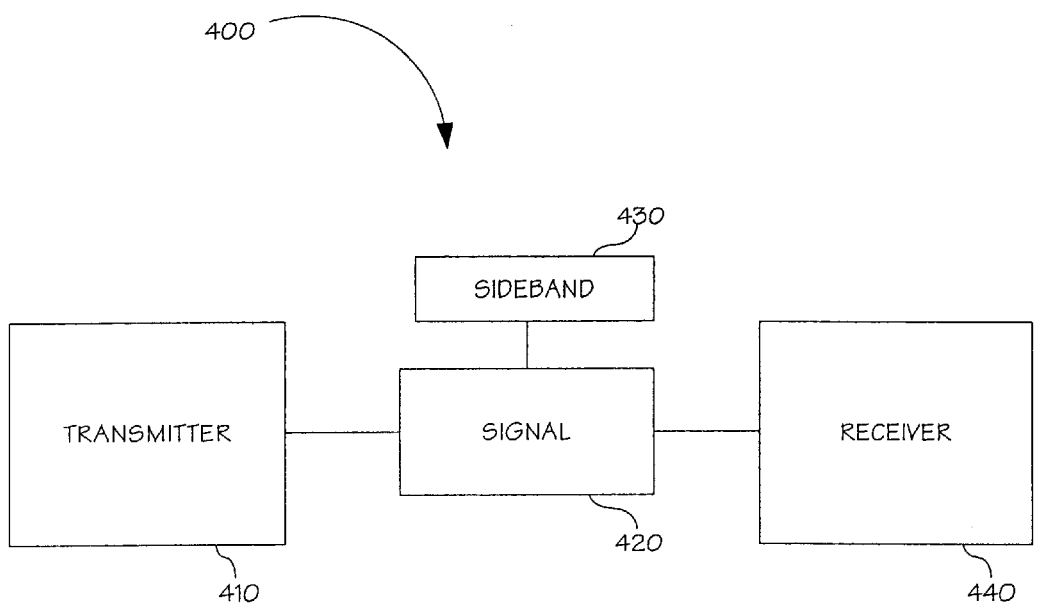
FIG. 4 is an exemplary block diagram representing the transmission of additional information in accordance with the present invention.

An alternative embodiment utilizes the emerging standard practice of radio broadcasters to transmit additional information in the form of an analog or digital sideband along with the main broadcast signal. Referring now to FIG. 4, an exemplary transmission system 400 may be employed and utilized with the present invention. A transmitter 410 may transmit a signal 420 that includes an analog or digital sideband 430 that may be received by a receiver 430. Such additional information that may be included within the sideband 430 may be the format of the radio broadcast. In this embodiment, if the radio signal strength of the selection made is below a threshold value, the tuner will scan for a signal above the threshold value whose sideband 430 indicates it is of the same format as the selected pre-programmed tuner button frequency.

Referring once again to FIG. 3, in another exemplary embodiment of the present invention, when the radio signal strength relating to the pre-programmed tuner button frequency is below a threshold value, the pre-programmed tuner button frequency may be muted and the present invention may alert the user to make another pre-programmed tuner button selection or utilize a seek function 380. For example, when a pre-programmed tuner button is depressed with a radio signal strength below a threshold value, then an audio alert stating "The selection made is out of range, please make another selection" may be generated by the present invention. This alert may notify the user that the selection is out of range and that further tuning is required to continue listening.

Figure 5:
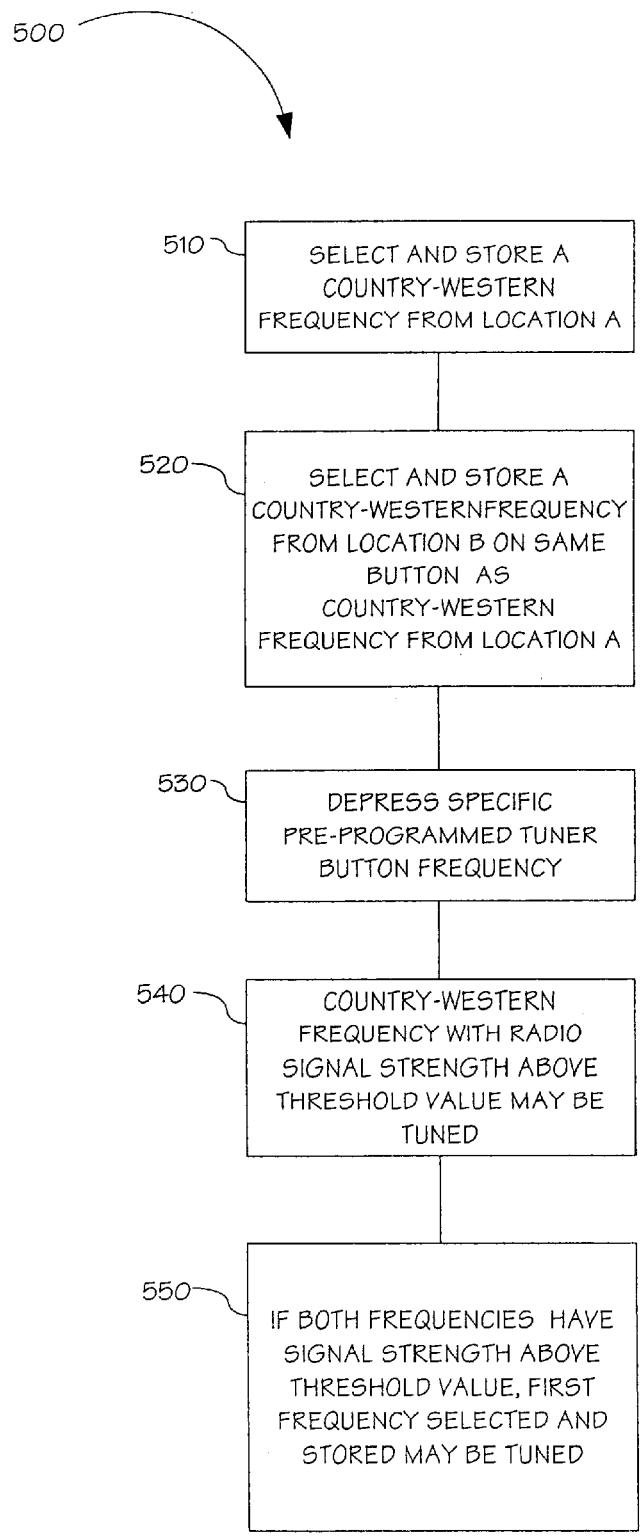
FIG. 5 is a flow diagram representing an alternate exemplary process of the present invention.

Referring to FIG. 5, another exemplary process of the present invention is shown. Such an exemplary process may be utilized by a user that may regularly engage in a commute from one location to another. Suppose, for example, a person drives 2 hours one way to deliver goods and returns in the evening. At each location and in areas in between, a user may not be able to clearly receive radio signals broadcast from both locations. Therefore, it would be advantageous to employ an exemplary process 500 by storing at least two different frequencies for each pre-programmed tuner button. For example, a country-western station broadcasting from location A 510 may be stored and a country-western station broadcasting from location B 520 may be stored, both utilizing the same pre-programmed tuner button frequency. Thus, it may be possible that while travelling from location A to location B, or while travelling from location B to location A, when the specific pre-programmed tuner button frequency is depressed 530, a country-western station may be tuned. The particular frequency that is tuned may be dependent upon the strength of the radio signal from location A and location B and whether the radio signal strength of each is above a threshold value. For example, if the radio signal from location A is above a threshold value and the radio signal from location B is below a threshold value, then the frequency relating to the radio signal from location A may be tuned 540. If the strength of both frequencies is above a threshold value, then, as an example the first pre-programmed tuner button frequency stored may be tuned 550. It should be understood that there are many actions that may be produced by the system of the present invention not described, yet however, are within the scope and spirit of the present invention. Embodiments described are intended only as examples and should not be considered as limiting the scope of the present invention.

Figure 6:
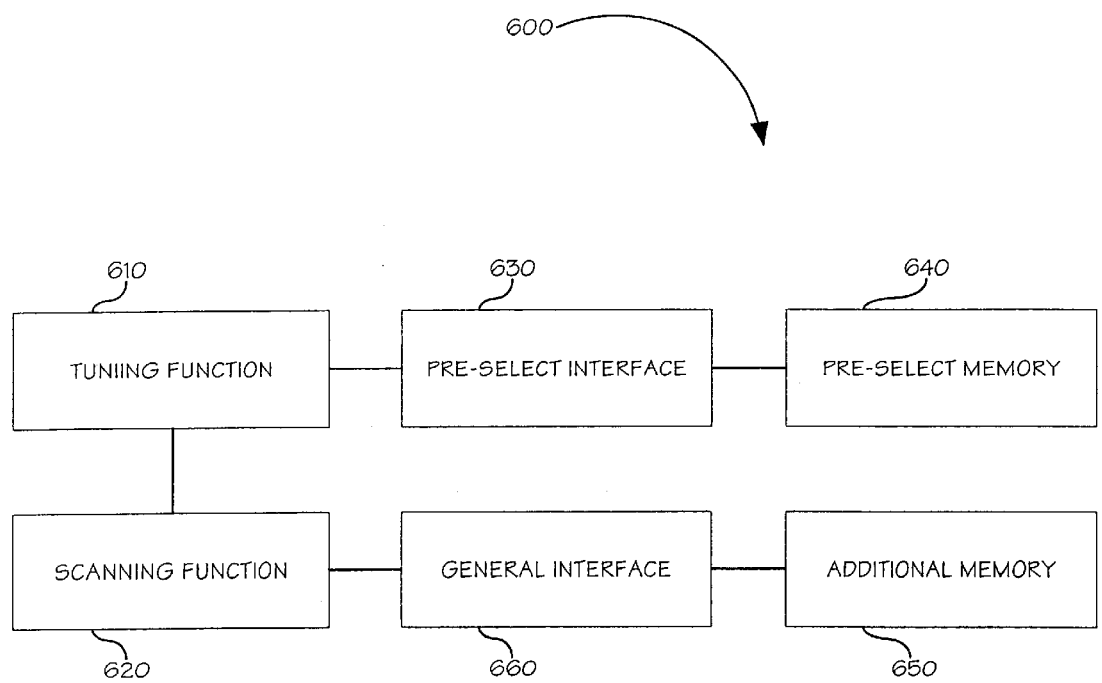
FIG. 6 is a block diagram representing elements of the present invention.

Turning to the implementation of exemplary embodiments of the present invention, an exemplary embodiment 600 of the present invention is shown in FIG. 6. In a preferred embodiment, the invention may include tuning function 610 and a scanning function 620 to scan the broadcast spectrum to determine viability of any pre-selected frequency. Included within the scanning function is the capability to determine the proper action when a pre-selected frequency has been chosen by a user when its signal strength is not above a threshold value. Actions may include muting the pre-selected frequency, tuning an alternate frequency selected by a user, and tuning an alternate frequency with a similar format.

In performing the tuning function 610 and scanning function 620, two separate and distinct tuners may be utilized in a preferred embodiment. With two separate tuners, the scanning tuner may be able to continuously update itself regarding the pre-selected frequencies that may be in range for clear listening. In another embodiment, the present invention could include one tuner that performs both the tuning function 610 and the scanning function 620. In order to implement the system with a single tuner, a scanning of the broadcast spectrum could occur at the occurrence of one of several events. When the system is turned on, a scan of the broadcast spectrum may be done to determine viability of the pre-selected frequencies. Further, a scan of the broadcast spectrum may be accomplished when a user initiates an action to recall one of the pre-selected frequencies. As a result, the system may verify viability of the pre-selected frequencies to determine the frequencies that have radio signals sufficient to support clear listening by the user.

In order to enter pre-programmed frequencies, a pre-select interface 630 may be required. This simply may involve executing a save function with the system. Pre-select memory 640 may be required for this function such that the saved frequencies may not be lost when the radio is turned off. Exemplary embodiments of the system of the present invention may also include additional memory 650 space suitable for storing and updating a database regarding station information for stations around the world in addition to that required for the pre-programmed tuner buttons. In order to enter the information to the system, a general interface 660 may be utilized to allow the user to enter database information and the like.

Although the invention has been described with a certain degree of particularity, it should be recognized that elements thereof may be altered by persons skilled in the art without departing from the spirit and scope of the invention. It is believed that the method and apparatus for automatic radio button mute and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. A broadcast receiving system, comprising:
    a broadcast tuner suitable for accepting broadcast signals from a range of frequencies;
    a user interface comprising a plurality of selectors, each of the selectors capable of being associated with one settable frequency, said user interface configured to be connected to said broadcast tuner; and
    a plurality of indicators in proximity to said plurality of selectors, each of the indicators in proximity to one of said selectors, said indicator being configured to change state to indicate that the signal strength of said one settable frequency associated with said selector is lower than a threshold value.

2. A broadcast receiving system according to claim 1, wherein said plurality of indicators is a plurality of visible lights.

3. A broadcast receiving system according to claim 1, wherein said plurality of indicators is a plurality of icons displayed on a display device.

4. A broadcast receiving system according to claim 1, further comprising an audible signal generator associated with said indicators that emits sound whereupon selecting of any one of said plurality of selectors and whereupon said signal strength of said one settable frequency is lower than said threshold value.

5. A broadcast receiving system according to claim 1, further comprising:
    a second broadcast tuner suitable for accepting broadcast signals from a range of frequencies; and
    a controller coupled to said broadcast tuner, said controller having access to said at least one settable frequency associated with said plurality of selectors, said controller controlling said plurality of indicators, said controller periodically scanning each said at least one settable frequency and comparing the signal strength of said at least one settable frequency to the threshold and updating said each indicator associated with each said at least one settable frequency to show whether said signal strength associated with said at lease one settable frequency is at least equal to said threshold.

6. A broadcast receiving system according to claim 5, wherein said plurality of indicators is a plurality of visible lights.

7. A broadcast receiving system according to claim 5, wherein said plurality of indicators is a plurality of icons displayed on a display device.

8. A method of generating a static-free music environment, comprising the following steps:
    capturing one particular frequency;
    storing said one particular frequency into a recall function in response to an input command;
    measuring the signal strength of said one particular frequency;
    determining if said signal strength of said one particular frequency is below a threshold value;
    if said one particular frequency is below said threshold value, muting said frequency; and
    displaying an indication in proximity to said recall function suitable to indicate that the signal strength of said one particular frequency is below the threshold value.

9. A method according to claim 8, wherein said indication is a plurality of visible lights.

10. A method according to claim 8, wherein said indication is a plurality of icons displayed on a display device.

11. A method according to claim 8, further comprising an audible signal generator associated with said indication that emits a sound when said signal strength of said settable frequency is lower than said threshold value.

12. A method of generating a static-free music environment, comprising the following steps:
    capturing one particular frequency;
    storing said one particular frequency into a recall function in response to an input command, said recall function being one of a plurality of user selectable recall functions;

utilizing said recall function to select said one particular frequency;

measuring the signal strength of said one particular frequency;

determining if said signal strength of said one particular frequency is below a threshold value;

if said signal strength is above said threshold value, tuning to said one particular frequency;

if said signal strength of said one particular frequency is below said threshold value, selecting a next recall function from said plurality of user selectable recall functions and selecting a second frequency that is associated with said next recall function.

13. A broadcast receiving system, comprising:

means for tuning across a broadcast spectrum;

means for accepting user input comprising a plurality of selectors;

means for storing a plurality of frequencies on said broadcast spectrum, said means for storing configured to connect to said means for tuning, each of said plurality of frequencies associated with one selector from said plurality of selectors;

means for accepting a stimulus to said one selector to recall one of said plurality of frequencies;

means for scanning said broadcast spectrum connected to said tuning means, wherein said scanning means is suitable for determining signal strength of each frequency of said plurality of frequencies and muting said each frequency if the signal strength of said each frequency is below a threshold value; and means for indicating when the signal strength of said each frequency is below said threshold value, said means for indicating being in proximity to said means for accepting a stimulus to said one selector to recall.

14. A broadcast receiving system according to claim 13, wherein said means for indicating is a visible light source.

15. A broadcast receiving system according to claim 13, wherein said means for indicating is an icon displayed on a display device.

16. A broadcast receiving system, comprising:

a broadcast tuner suitable for accepting broadcast signals from a range of frequencies;

a user interface comprising a plurality of selectors, each selector associated with one settable frequency, connected to said broadcast tuner;

a controller connected to said broadcast tuner and said plurality of selectors, upon said controller detecting selection of any one of said plurality of selectors, said controller initiates measurement of the signal strength of said one settable frequency associated with said one of said plurality of selectors, said controller configured to compare said measurement to a threshold value;

if the signal strength of said one settable frequency associated with said one of said plurality of selectors is at least equal to said threshold value, said controller instructs said broadcast tuner to tune to said one settable frequency associated with said one of said plurality of selectors; and if the signal strength of said one settable frequency associated with said one of said plurality of selectors is lower than said threshold value, said controller selects a next selector from said plurality of selectors.

17. A broadcast receiving system according to claim 16, further comprising:

said controller instructs said broadcast tuner to tune to a one settable frequency associated with said next selector from said plurality of selectors.

18. A broadcast receiving system, comprising:

an audio system for providing sound content;

a primary broadcast tuner suitable for accepting broadcast signals from a range of frequencies, said primary broadcast tuner connected to said audio system being capable of delivering said sound content;

a secondary broadcast tuner suitable for measuring the signal strength of broadcast signals from a range of frequencies;

a user interface comprising a plurality of selectors, each selector associated with one settable frequency and each selector associated with one indicator;

a controller connected to said primary broadcast tuner, said controller connected to said secondary broadcast tuner, and said controller connected to said plurality of selectors, upon said controller detecting selection of any one of said plurality of selectors, said controller instructs said secondary broadcast tuner to initiate measurement of a first signal strength of said one settable frequency associated with said selector and compares said first signal strength to a threshold value;

if said signal strength of said first target frequency is at least equal to said threshold value, said controller instructs said primary broadcast tuner to tune to said first target frequency; and if the signal strength is lower than said threshold value, said controller selects a next selector from said plurality of selectors and said controller changes the state of said indicator associated with said selector.

19. A broadcast receiving system according to claim 18, further comprising:

said controller instructs said primary broadcast tuner to tune to a second frequency associated with said next selector from said plurality of selectors.

20. A broadcast receiving system according to claim 18, further comprising:

said controller instructs said secondary broadcast tuner to initiate measurement of a second signal strength of said second frequency associated with said second selector from said plurality of selectors and compares said second signal strength to said threshold value; and if said second signal strength is at least equal to said threshold value, said controller instructs said primary broadcast tuner to tune to said second frequency.

21. A broadcast receiving system, comprising:

a broadcast tuner suitable for accepting broadcast signals from a range of frequencies; and a user interface comprising a plurality of selectors, each selector associated with one settable frequency, said user interface connected to said broadcast tuner, wherein upon selection of one of said plurality of selectors, the signal strength of said one settable frequency is compared to a threshold value, and if the signal strength is lower than said a threshold value, said settable frequency is automatically muted; and a plurality of indicators, each indicator configured in proximity to one of said plurality of selectors, one of each indicator that is in proximity to the selected selector changing to indicate that said one settable frequency associated with said selected selector is lower than said threshold value.

* * * * *